(12) United States Patent
Fan et al.

(10) Patent No.: US 12,701,750 B2
(45) Date of Patent: Aug. 4, 2026

(54) NON-VOLATILE MEMORY DEVICE AND METHOD FOR MANUFACTURING THE SAME

(71) Applicant: IOTMEMORY TECHNOLOGY INC., Taipei City (TW)

(72) Inventors: Der-Tsyr Fan, Taoyuan City (TW); I-Hsin Huang, Taoyuan City (TW); Tzung-Wen Cheng, New Taipei City (TW); Yu-Ming Cheng, Yilan County (TW)

(73) Assignee: IOTMEMORY TECHNOLOGY INC., Taipei City (TW)

( * ) Notice: Subject to any disclaimer, the term of this patent is extended or adjusted under 35 U.S.C. 154(b) by 370 days.

(21) Appl. No.: 18/377,319

(22) Filed: Oct. 6, 2023

(65) Prior Publication Data

US 2024/0162316 A1 May 16, 2024

Related U.S. Application Data

(60) Provisional application No. 63/467,605, filed on May 19, 2023, provisional application No. 63/424,139, filed on Nov. 10, 2022.

(51) Int. Cl.
H10D 30/68 (2025.01)
H10B 41/30 (2023.01)
(Continued)

(52) U.S. Cl.
CPC ......... H10D 30/6892 (2025.01); H10B 41/30 (2023.02); H10D 30/0411 (2025.01); H10D 30/683 (2025.01); H10D 64/035 (2025.01)

(58) Field of Classification Search
CPC .. H10B 41/30; H10D 30/0411; H10D 30/681; H10D 30/683; H10D 30/6892; H10D 64/035
See application file for complete search history.

(56) References Cited

U.S. PATENT DOCUMENTS

| | | | |
|---|---|---|---|
| 6,248,631 B1 | 6/2001 | Huang | |
| 8,101,477 B1 | 1/2012 | Power | |

(Continued)

FOREIGN PATENT DOCUMENTS

| | | |
|---|---|---|
| CN | 204792794 | 11/2015 |
| CN | 106206588 | 12/2016 |

(Continued)

*Primary Examiner* — Hoai V Pham
(74) *Attorney, Agent, or Firm* — Winston Hsu

(57) ABSTRACT

A non-volatile memory device includes at least one memory cell and the memory cell includes a substrate, a select gate, a control gate, a floating gate, and an erase gate. The select gate is disposed on the substrate, and the control gate is disposed on the substrate and laterally spaced apart from the select gate. The control gate comprises a non-vertical surface. The floating gate includes a vertical portion and a horizontal portion. The vertical portion disposed between the select gate and the control gate and includes a first top tip laterally spaced apart from the control gate. The horizontal portion is disposed between the substrate and the control gate, where the horizontal portion includes a lateral tip laterally and vertically spaced apart from the control gate. The erase gate covers the non-vertical surface of the control gate and the lateral tip of the horizontal portion of the floating gate.

16 Claims, 11 Drawing Sheets

(51) Int. Cl.
    *H10D 30/01*     (2025.01)
    *H10D 64/01*     (2025.01)

(56)         References Cited

U.S. PATENT DOCUMENTS

| | | | |
|---|---|---|---|
| 8,530,950 B1 | 9/2013 | Kang | |
| 9,911,847 B1 * | 3/2018 | Chin | H10D 30/6892 |
| 2003/0162347 A1 | 8/2003 | Wang | |
| 2004/0041202 A1 | 3/2004 | Kim | |
| 2005/0006691 A1 | 1/2005 | Wu | |
| 2005/0269624 A1 | 12/2005 | Hu | |
| 2006/0175654 A1 | 8/2006 | Pan | |
| 2006/0205136 A1 | 9/2006 | Tessariol | |
| 2007/0257299 A1 | 11/2007 | Chen | |
| 2008/0285344 A1 | 11/2008 | Ruttkowski | |
| 2011/0281427 A1 | 11/2011 | Choi | |
| 2012/0295413 A1 | 11/2012 | Fujii | |
| 2013/0026552 A1 | 1/2013 | Toh | |
| 2013/0112935 A1 | 5/2013 | Himeno | |
| 2013/0313626 A1 | 11/2013 | Huang | |
| 2014/0042383 A1 | 2/2014 | Inokuma | |
| 2016/0225777 A1 | 8/2016 | Cheng | |
| 2016/0336415 A1 | 11/2016 | Wu | |
| 2016/0358928 A1 | 12/2016 | Wu | |
| 2016/0365350 A1 | 12/2016 | Chuang | |
| 2017/0040334 A1 | 2/2017 | Cheng | |
| 2020/0152649 A1 | 5/2020 | Chern | |
| 2020/0251480 A1 | 8/2020 | Jang | |
| 2020/0350325 A1 | 11/2020 | Zhang | |
| 2021/0066324 A1 | 3/2021 | Cai | |
| 2021/0358927 A1 | 11/2021 | Wang | |
| 2021/0384205 A1 | 12/2021 | Zhang | |

| | | | |
|---|---|---|---|
| 2021/0408119 A1 | 12/2021 | Himeno | |
| 2022/0293614 A1 | 9/2022 | Cai | |
| 2022/0293756 A1 | 9/2022 | Xing | |
| 2022/0359552 A1 | 11/2022 | Liu | |
| 2023/0232623 A1 | 7/2023 | Fan | |
| 2023/0328972 A1 * | 10/2023 | Wang | H10B 41/30 |
| 2024/0162315 A1 | 5/2024 | Fan | |

FOREIGN PATENT DOCUMENTS

| | | |
|---|---|---|
| CN | 109216364 | 1/2019 |
| CN | 111180447 | 4/2023 |
| DE | 10 2011 053 110 | 3/2017 |
| JP | 7-106446 A | 4/1995 |
| JP | 10-32270 | 2/1998 |
| JP | 11-111866 A | 4/1999 |
| JP | 2001-85543 | 3/2001 |
| JP | 2014-96421 A | 5/2014 |
| KR | 1999-0057075 | 7/1999 |
| RU | 2 216 821 C2 | 11/2003 |
| RU | 2 297 625 C1 | 4/2007 |
| TW | 200729514 | 8/2007 |
| TW | 201508753 A | 3/2015 |
| TW | M513458 U | 12/2015 |
| TW | 201633319 A | 9/2016 |
| TW | 201640621 | 11/2016 |
| TW | 201644037 A | 12/2016 |
| TW | 201839770 A | 11/2018 |
| TW | 202018917 A | 5/2020 |
| TW | 202114174 A | 4/2021 |
| TW | 202236627 A | 9/2022 |
| WO | 2020/179199 A1 | 9/2020 |
| WO | 2022/191864 A1 | 9/2022 |

* cited by examiner

NON-VOLATILE MEMORY DEVICE AND METHOD FOR MANUFACTURING THE SAME

CROSS REFERENCE TO RELATED APPLICATIONS

This application claims the benefit of U.S. Provisional Application No. 63/424,139, filed on Nov. 10, 2022. Further, this application claims the benefit of U.S. Provisional Application No. 63/467,605, filed on May 19, 2023. The contents of these applications are incorporated herein by reference.

BACKGROUND OF THE INVENTION

1. Field of the Invention

The invention relates to a semiconductor device, and more particularly, to a non-volatile memory device and a method for manufacturing the same.

2. Description of the Prior Art

Since a non-volatile memory can, for instance, repeatedly perform operations such as storing, reading, and erasing data, and since stored data is not lost after the non-volatile memory is shut down, the non-volatile memory has been extensively applied in personal computers and electronic equipment.

A conventional structure of non-volatile memory has a stack-gate structure, including a tunneling oxide layer, a floating gate, a coupling dielectric layer, and a control gate disposed on a substrate in order. When a programming or erase operation is performed on such a flash memory device, a suitable voltage is respectively applied to the source region, the drain region, and the control gate, such that electrons are injected into a floating gate, or electrons are pulled out from the floating gate.

In the programming and erase operation of the non-volatile memory, a greater gate-coupling ratio (GCR) between the floating gate and the control gate generally means a lower operating voltage is needed for the operation, and the operating speed and the efficiency of the flash memory are significantly increased as a result. However, during programming or erase operations, electrons have to be injected into or pulled out of the floating gate through a tunneling oxide layer disposed under the floating gate, which often causes damages to the structure of the tunneling oxide layer and thus reduces the reliability of the memory device.

In order to increase the reliability of the memory device, an erase gate is adopted and incorporated into to the memory device, which is capable of pulling the electrons from the floating gate by applying a positive voltage to the erase gate. Thus, since the electrons in the floating gate is pulled out through a tunneling oxide layer disposed on the floating gate rather than through the tunneling oxide layer disposed under the floating gate, the reliability of the memory device is further improved.

With an increasing demand for high-efficient memory devices capable of erasing the stored data more efficiently, there is still a need to provide an improved memory device and a method for manufacturing the same.

SUMMARY OF THE INVENTION

The invention provides a non-volatile memory device and a method for manufacturing a non-volatile memory device. The non-volatile memory device is capable of erasing the stored data more efficiently.

According to some embodiments of the present disclosure, a non-volatile memory device includes at least one memory cell and the memory cell includes a substrate, a select gate, a control gate, a floating gate, and an erase gate. The select gate is disposed on the substrate, and the control gate is disposed on the substrate and laterally spaced apart from the select gate. The control gate includes a non-vertical surface. The floating gate includes a vertical portion and a horizontal portion. The vertical portion is disposed between the select gate and the control gate, and includes a first top tip laterally spaced apart from the control gate. The horizontal portion is disposed between the substrate and the control gate, and the horizontal portion includes a lateral tip laterally and vertically spaced apart from the control gate. The erase gate covers the non-vertical surface of the control gate and the tips of the vertical and/or the horizontal portions of the floating gate.

According to some embodiments of the present disclosure, a method for manufacturing a non-volatile memory device including the following steps: providing a substrate; forming a select gate on the substrate; forming a conformal conductive layer on the substrate and the select gate; forming a control gate covering a sidewall of the select gate and the substrate, where the control gate includes a non-vertical surface; etching the conformal conductive layer exposed from the control gate to thereby form a floating gate, the floating gate including: a vertical portion disposed between the select gate and the control gate; and a horizontal portion disposed between the substrate and the control gate, where both the vertical and horizontal portions include tips; and forming an erase gate covering not only the non-vertical surface of the control gate but also the top and lateral tips of the vertical and horizontal portions of the L-shape floating gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
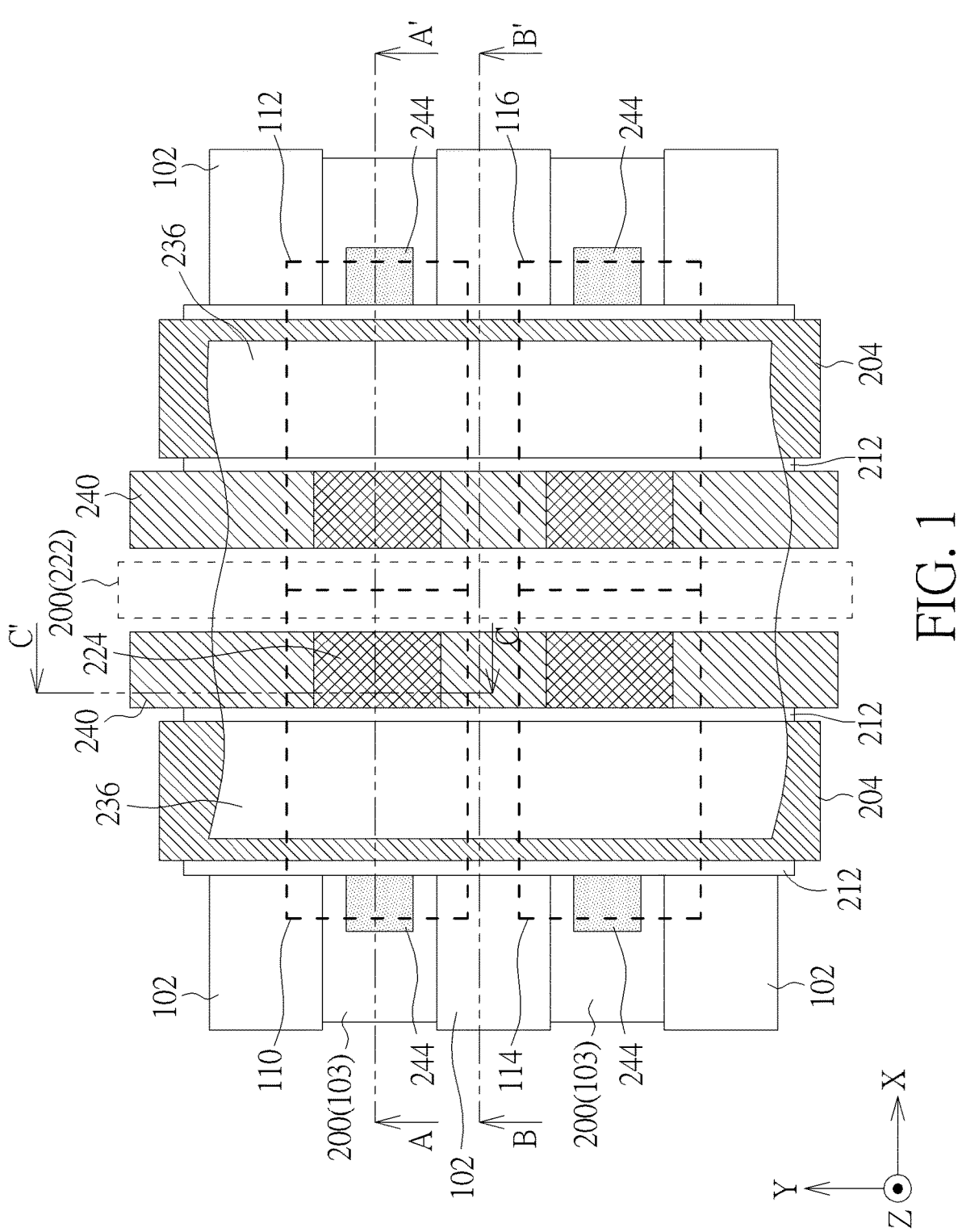
FIG. 1 is a schematic top view of a non-volatile memory device according to some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

Although the disclosure is described with respect to specific embodiments, the principles of the disclosure, as defined by the claims appended herein, may obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

FIG. 1 is a schematic top view of a non-volatile memory device according to some embodiments of the present disclosure. Referring to FIG. 1, a non-volatile memory device 100 can be a NOR flash memory device including at least one memory cell, such as four memory cells accommodated in the first, second, third, and fourth memory cell regions 110, 112, 114, and 116, respectively. The structures in the first memory cell region 110 and the second memory cell region 112 have a mirror image of each other, and the structures in the third memory cell region 114 and the fourth memory cell region 116 have a mirror image of each other. According to one embodiment of the present disclosure, the non-volatile memory device 100 includes more than four memory cells, and these memory cells can be arranged in an array with numerous rows and columns.

Referring to FIG. 1, the non-volatile memory device includes a substrate 200 and an isolation structure 102. The substrate 200 can be a semiconductor substrate, such as a silicon substrate or silicon-on-insulator (SOI) substrate, but not limited thereto. The isolation structure 102 can be made an insulating material and is used to define active areas 103 of the memory cells.

Each of the memory cells includes a source region 222 and a drain region 244 disposed in the active area 103 defined by the isolation structure 102. The source region 222 and the drain region 244 can be doped regions of the same conductivity type, such as n-type or p-type. The conductivity type of the source region 222 and the drain region 244 is different from the conductivity type of the substrate 200, or different from the conductivity type of a doped well (not shown) used to accommodate the source region 222 and the drain region 244. The source region 222 can be disposed at one end of the active area 103, and the drain region 244 can be arranged at another end of the active area 103. According to some embodiments of the present disclosure, the source region 222 is a continuous region extending along a Y-direction and shared by the memory cells in the same column.

Each memory cell can further include a select gate 206 disposed on the substrate 200 and adjacent to the drain region 244. The select gate 206 can extend along the Y-direction and shared by the memory cells that are located in the same column. The select gate 204 can be made of conductive material such as poly silicon or metal, and select gate 204 can act as a word line configured to turn on/off the channel regions of the memory cells arranged in the same column.

A dielectric spacer 212 can be disposed on the sidewalls of the select gate 204 in order to insulate the select gate 204 from other conductive components. The dielectric spacer 212 can be a single-layered, double-layered, or a multilayered spacer disposed on each sidewall of the select gate 204, but not limited thereto.

Each memory cell also includes a floating gate 224 disposed on the substrate 200 and adjacent to the source region 222. Thus, the floating gate 224 is disposed at one side of the select gate 204, and the drain region 244 is disposed at another side of the select gate 204. The floating gates 224 are made of conductive material, such as polysilicon or other semiconductor. The floating gates 224 are spaced apart from each other so that the electric current could not directly transmitted between the floating gates 224. Since the floating gates 224 are spaced apart from each other, each the floating gate 224 can be programed or erased independently to thereby determine the state of each memory cell, such as state "1" or state "0". As shown in the following cross-sectional views such as FIG. 2, each floating gate 224 is an L-shaped floating gate with a vertical portion and a horizontal portion. The detailed structure of the floating gate 224 is described in the description corresponding to FIG. 2.

Each memory cell also includes a control gate 240 disposed on the substrate 200 and adjacent to the source region 222. The control gate 240 can extend along the Y-direction and shared by the memory cells that are located in the same column. Thus, the floating gates 224 can be covered with the control gate 240 that are in the same column. Besides, as the floating gate 224 is the L-shaped floating gate with the vertical portion and the horizontal portion, only the horizontal portion of the floating gate 224 is covered with the control gate 240, and the vertical portion of the floating gate 224 is not covered with the control gate 240. The control gate 240 can be made of conductive material such as poly silicon or metal, and the control gate 240 is configured to make hot carriers (e.g. electrons) injected from the channel into the floating gate 224.

The non-volatile memory device 100 further includes an erase gate 236 extending along the Y-direction. Besides, the erase gate 236 can be a continuous layer extending from the first memory cell region 110 to the second memory cell region 112, and fills up the gap at the boundary between the first memory cell region 110 and the second memory cell region 112 (such as a gap between the two adjacent floating gates 224 in the same row). Therefore, the erase gate 236 can cover at least two floating gates 224 and two control gate 240 in the first memory cell region 110 and the second memory cell region 112. In an erasing operation of the non-volatile memory 100, the erase gate 236 is biased, which causes the electrons stored in the floating gate 224 to be pulled out mainly through a tip (also called a corner) of the horizontal portion (not shown) of the floating gate 224.

Figure 2:
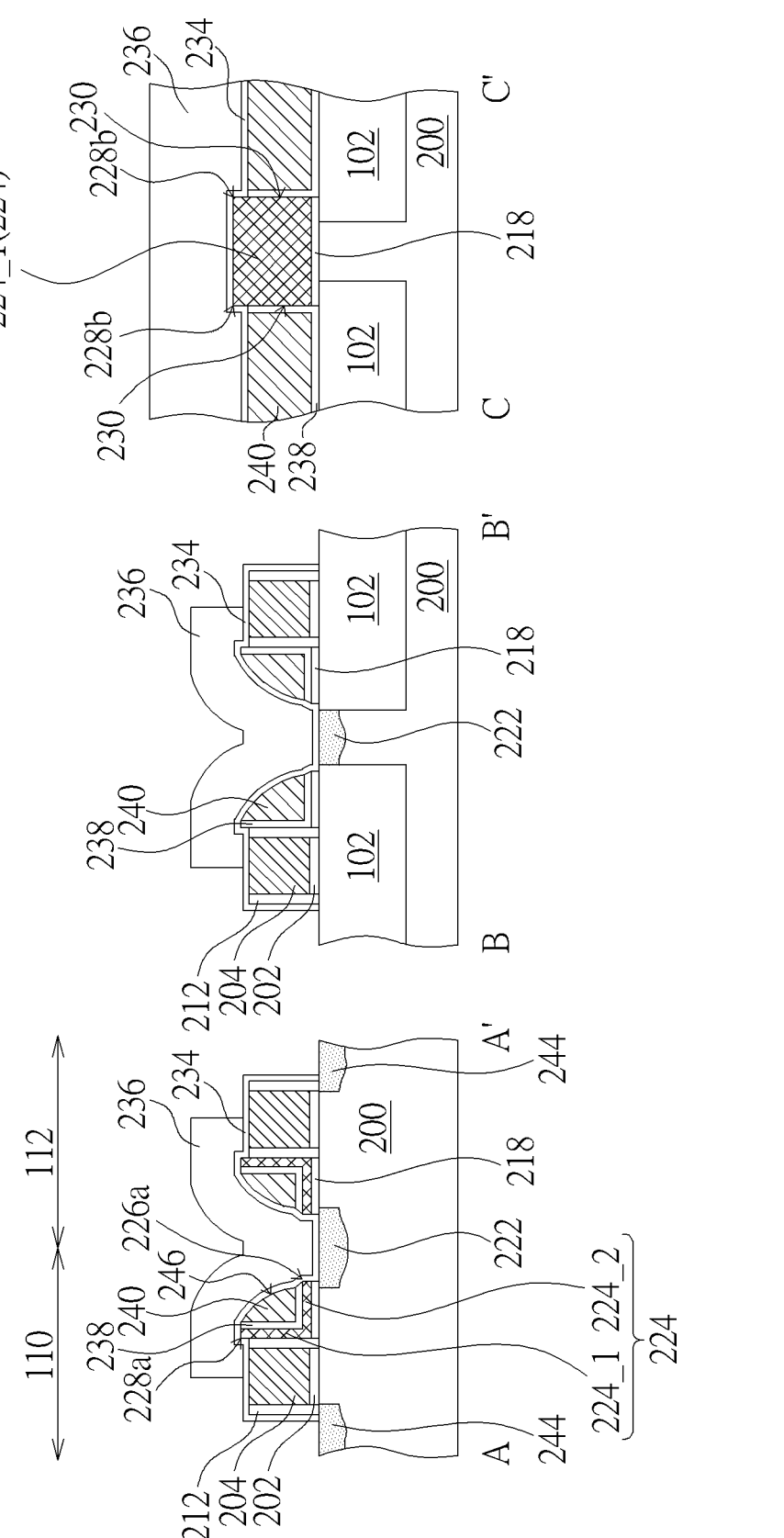
FIG. 2 is a schematic cross-sectional view of a non-volatile memory device corresponding to line A-A', line B-B' and line C-C' of FIG. 1 according to some embodiments of the present disclosure.

FIG. 2 is a schematic cross-sectional view of a non-volatile memory device corresponding to line A-A', line B-B' and line C-C' of FIG. 1 according to some embodiments of the present disclosure. Referring to view AA' of FIG. 2, the floating gate 224 is the L-shaped floating gate with the vertical portion 224_1, the horizontal portion 224_2, and a corner portion (not shown). The corner portion is at a lower corner of the floating gate and connected to both the vertical portion 224_1 and the horizontal portion 224_2. The vertical portion 224_1 of the floating gate 224 is disposed between the select gate 204 and the control gate 240, and the horizontal portion 224_2 of the horizontal portion 224_2 is disposed between the substrate 200 and the control gate 240, where the horizontal portion 224_1 of the floating gate 224 includes a lateral tip 226a laterally (e.g. the X-direction) spaced apart from the control gate 240. The top surface of the vertical portion 224_1 of the floating gate 224 is higher than a top surface of the select gate 204. Besides, the vertical portion 224_1 of the floating gate 224 further includes two first top tips 228a and two first sidewalls. The first top tips 228a are opposite each other and arranged along a first direction, e.g. the X-direction. The first sidewalls opposite each other and arranged along the first direction, e.g. X-direction, where the first sidewalls 230 are connected to the first top tips 228a of the vertical portion 224_1 of the floating gate 224, respectively.

Referring to view AA' of FIG. 2, the control gate 240 includes a non-vertical surface 246, such as an inclined surface or a curved surface. The non-vertical surface 246 can be a convex surface. The bottom surface of the control gate 240 is lower than the top surface of the vertical portion 224_1 of the floating gate 224.

Referring to view AA' of FIG. 2, the erase gate 236 is a continuous layer extending from the first memory cell region 110 to the second memory cell region 112. The erase gate 236 covers the non-vertical surface 246 of the control gate 240, the lateral tip 226a of the horizontal portion 224_2 of the floating gate 224, and the top surface of the vertical portion 224_1 of the floating gate 224. The erase gate 236 partially covers the non-vertical surface 246 of the control gate 240, and thus that portion of the bottom surface of the erase gate 236 is a curved surface.

In the erasing operation, the electron stored in the floating gate 224 can be pulled out not only from the first top tip 228a of the vertical portion 224_1 but also from the lateral tip 226a of the horizontal portion 224_2. Thus, the electron stored in the floating gate 224 can be discharged more effectively.

Referring to view AA' of FIG. 2, the non-volatile memory device 100 further include a coupling dielectric layer 238 disposed between the control gate 240 and the floating gate 224. The coupling dielectric layer 238 is an L-shaped coupling dielectric layer, and the coupling dielectric layer 238 is a composite dielectric layer including silicon oxide/silicon nitride/silicon oxide, but not limited thereto.

Referring to view AA' of FIG. 2, the non-volatile memory device 100 further include an erase gate dielectric layer 234 disposed between the erase gate 236 and floating gate 224, and between the erase gate 236 and control gate 240. The erase gate dielectric layer 234 can be made of dielectric layer which allows electrons originally stored in the floating gate 224 to pass through it by Fowler-Nordheim (FN) tunneling mechanism.

Referring to view AA' of FIG. 2, a floating gate dielectric layer 218 is disposed at least between the substrate 200 and the floating gate 224. The material of the floating gate dielectric layer 218 is, for instance, silicon oxide or other layers. During a programming operation, hot electrons are allowed to pass through the floating gate dielectric layer 218 and accumulate in the floating gate 224.

Referring to view BB' of FIG. 2, the control gate 240 and the erase gate 236 can be disposed on the isolation structure 102. Thus, the control gate 240 can be disposed between the erase gate 236 and the isolation structure 102. Besides, the isolation structure 102 shown in view BB' is not covered with the floating gate 224.

Referring to view CC' of FIG. 2, the vertical portion 224_1 of the floating gate 224 further includes second top tips 228b and second sidewalls 230 which are opposite each other and arranged along a second direction different from the first direction, e.g. the Y-direction. The erase gate 236 extends along the second direction and covers the second top tips 228b and the second sidewalls 230 of the vertical portion 224_1 of the floating gate 224. Besides, lower portions of the second sidewalls 230 can be covered with the coupling dielectric layer 238, and the upper portions of the second sidewalls 230 can be covered with the erase gate dielectric layer 234. Because of the existence of the control gate 240, a bottom surface of the erase gate 236 extending beyond the second sidewall 230 of the floating gate 224 is spaced apart from the isolation structure 102.

Figure 3:
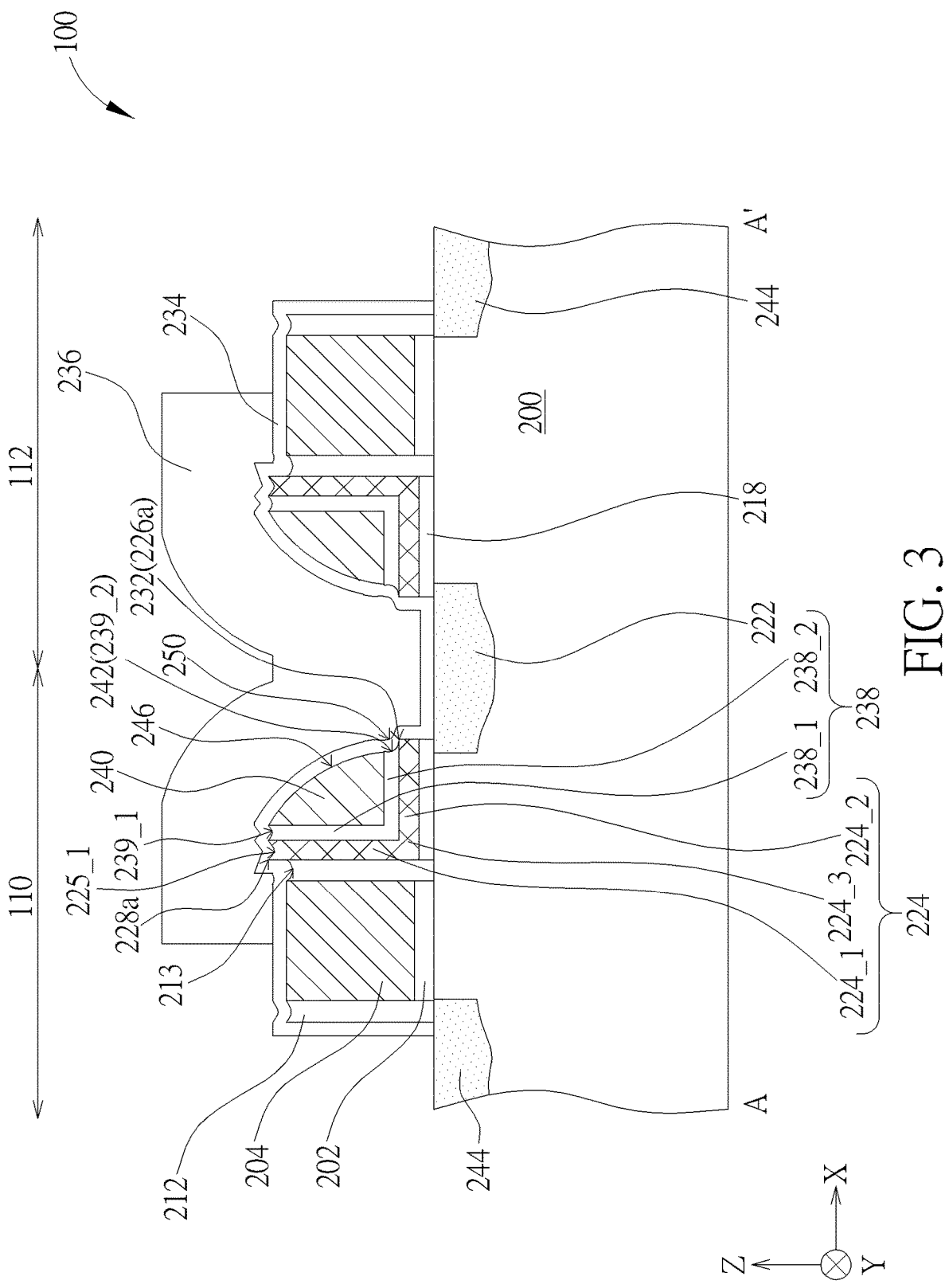
FIG. 3 is a schematic cross-sectional view of a non-volatile memory device corresponding to line A-A' of FIG. 1 according to some embodiments of the present disclosure.

FIG. 3 is a schematic cross-sectional view of a non-volatile memory device corresponding to line A-A' of FIG. 1 according to some embodiments of the present disclosure. The structure shown in FIG. 3 can be regarded as an enlarged cross-sectional view of the structure shown in view AA' of FIG. 2. Referring to FIG. 3, the floating gate 224 is L-shaped and includes the vertical portion 224_1, the horizontal portion 224_2, and the corner portion 224_3.

The top surface 225_1 of the vertical portion 224_1 includes a concave surface which causes the first top tip 228a of the vertical portion 224_1 to become sharper. Thus, the electron originally stored in the floating gate 224 can be pulled out through the first top tip 228a of the vertical portion 224_1 of the floating gate 224 more effectively.

The horizontal portion 224_2 includes a protruding portion 232 exposed from the control gate 240. The upper corner of the protruding portion 232 corresponds to the lateral tip 226a which is laterally and vertically spaced apart from the control gate 240. The lateral tip 226a of the floating gate 224 can be covered with a thin layer of the coupling dielectric layer 238. For example, the thickness of the coupling dielectric layer 238 covering the lateral tip 226a of the floating gate 224 can be on the order of 5 Angstroms to 30 Angstroms, but not limited thereto. In order to erase the charges stored in the floating gate 224 more efficiently, the lateral tip 226a may not be covered with any coupling dielectric layer 238. Thus, the lateral tip 226a is in direct contact with the erase gate dielectric layer 234.

The corner portion 224_3 is at a lower corner of the floating gate 224 and laterally spaced apart from the control gate 240.

The coupling dielectric layer 238 is also L-shaped and includes the vertical portion 238_1 and the horizontal portion 238_2. The vertical portion 238_1 of the coupling dielectric layer 238 is disposed between the control gate 240 and the vertical portion 224_1 of the floating gate 224. The vertical portion 238_1 of the coupling dielectric layer 238 includes a top surface 239_1 with a curved profile. The horizontal portion 238_2 is disposed between the control gate 240 and the horizontal portion 224_2 of the floating gate 224, where an end portion 242 of the horizontal portion 238_2 of the coupling dielectric layer 238 extends from below the control gate 240 and is exposed from the control gate 240. The end portion 242 of the horizontal portion 238_2 of the coupling dielectric layer 238 includes a non-vertical sidewall 239_2 exposed from the control gate 240. The non-vertical sidewall 239_2 is a concave surface in direct contact with the erase gate dielectric layer 234.

The erase gate 236 is filled into the gap at the boundary between the first memory cell region 110 and the second memory cell region 112. Because the non-vertical sidewall 239_2 of the end portion 242 of the coupling dielectric layer 238 has the concave surface, a portion of the erase gate 236 can correspondingly have a protruding portion 250 extending toward the non-vertical sidewall 239_2 of the end portion 242 of the coupling dielectric layer 238. The protruding portion 250 can cover the lateral tip 226a of the horizontal portion 224_2 of floating gate 224, which causes the erase gate 236 to partially wrap around the lateral tip 226a of the floating gate 224. Thus, the electron originally stored in the floating gate 224 can be pulled out through the lateral tip 226a of the horizontal portion 224_2 more effectively.

The dielectric spacer 212 is disposed between the select gate 204 and the vertical portion 224_1 of the floating gate 224, where the dielectric spacer 212 includes a curved top surface 213 lower than the top surface 225_1 of the vertical portion 224_1 of the floating gate 224.

Figure 4:
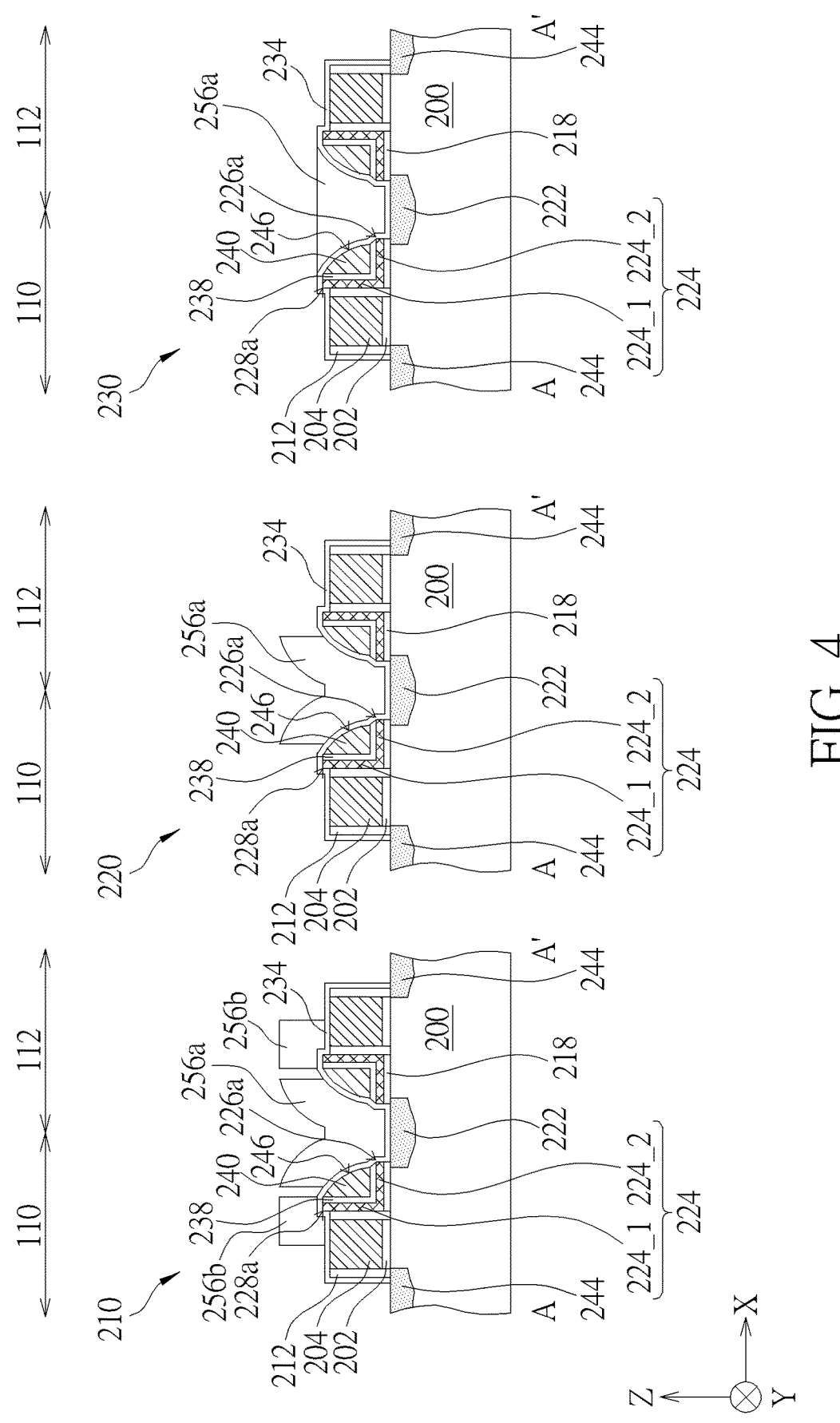
FIG. 4 is a schematic cross-sectional view of various non-volatile memory devices corresponding to line A-A' of FIG. 1 according to alternative embodiments of the present disclosure.

FIG. 4 is a schematic cross-sectional view showing various non-volatile memory devices according to alternative embodiments of the present disclosure. Non-volatile memory devices 210, 220, 230 are analogous to the non-volatile memory device 100 shown in FIG. 3, the main difference is the configuration of the erase gate.

For the non-volatile memory devices 210, the non-volatile memory devices 210 includes a first erase gate 256a and a second erase gate 256b extending along the Y-direction and separated from each other. The first erase gate 256a covers the lateral tip 226a of the horizontal portion 224_2 of the floating gate 224, and the second erase gate 256b covers the top surface of the vertical portion 224_1 of the floating gate 224. During an erasing operation, the first erase gate 256a is configured to be biased with a first voltage, and the second erase gate 256b is configured to be biased with a second voltage different from the first voltage. Thus, the electron stored in the floating gate 224 can be discharged more effectively by independently adjusting the values of the first voltage and the second voltage.

For the non-volatile memory devices 220, the non-volatile memory devices 220 is analogous to the non-volatile memory devices 210, however, the second erase gate 256b is omitted so that the top surface of the vertical portion 224_1 of the floating gate 224 is not covered with any erase gate.

For the non-volatile memory devices 230, the non-volatile memory devices 230 is analogous to the non-volatile memory devices 220, however, the first erase gate 256a includes a flat top surface, and the height of the first erase gate 256a is at most 20% higher than the height of the select gate 204. Since the height of the first erase gate 256a is not much higher than the height of the select gate 204, the non-volatile memory devices 230 can be readily integrated with other semiconductor devices, such as MOSFET, in a digital circuit. Thus, the non-volatile memory devices 230 and other semiconductor devices in the digital circuit can be manufactured concurrently without significantly adjusting the process for manufacturing the semiconductor devices.

FIG. 5 to FIG. 11 are cross-sectional views at various stages of manufacture of a method for manufacturing the non-volatile memory device of FIGS. 1-3 according to some embodiment of the invention. In FIG. 5 to FIG. 11, view AA' corresponds to the line A-A' of FIG. 1.

Figure 5:
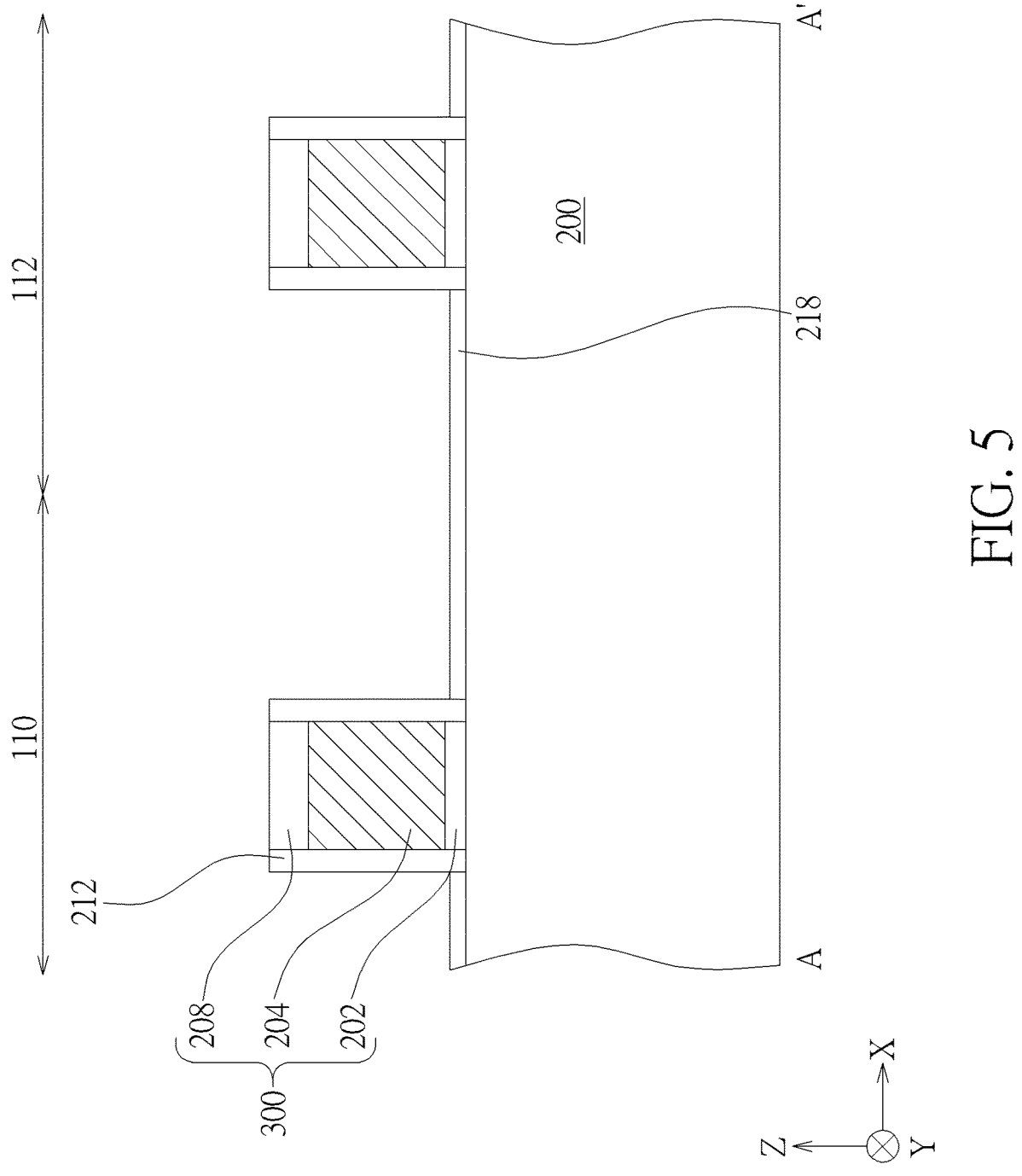
FIG. 5 to FIG. 11 are schematic cross-sectional views at various stages of manufacture of a method for manufacturing the non-volatile memory device of FIGS. 1 and 4 according to some embodiments of the present disclosure.

Referring to FIG. 5, a structure formed at this manufacturing stage includes at least a substrate 200, at least one stacked structure 300, a dielectric spacer 212, a floating gate dielectric layer 218.

According to some embodiments of the present disclosure, the substrate 200 may be a semiconductor substrate with suitable conductivity type, such as p-type or n-type. The composition of the substrate 200 may include silicon, germanium, gallium nitride or other suitable semiconductor materials, but not limited thereto.

At least one stacked structure 300 is on the substrate 200. For example, two stacked structures 300 are disposed on the substrate 200 and laterally spaced apart from each other. Each of the stacked structures 300 includes a gate dielectric layer 202, a select gate 204, and a sacrificial layer 208 stacked in order. The select gate 204 is made of conductive material, and the select gate 204 is configured to turn on/off of a carrier channel (also called channel region) in the substrate 200 underlying the select gate 204 when biased with a suitable voltage. The sacrificial layer 208 is an uppermost layer in the stacked structure 300, which is a temporary layer configured to be removed before the subsequent process of forming an erase gate on the select gate 204. In some embodiments, the select gate 204 formed at the stage of manufacture shown in FIG. 5 can be a conductive layer with a pattern different the pattern of the select gate 204 shown in FIGS. 1 and 2. Thus, if the select gate 204 shown in FIG. 5 has a contour different from that of the select gate 204 shown in FIGS. 1 and 2, the select gate 204 can be further patterned in the following manufacturing processes to become the select gate 204 shown in FIGS. 1 and 2.

The dielectric spacer 212 is formed on the sidewalls of the stacked structures 300. The material of the dielectric spacer 212 is, for instance, silicon oxide/silicon nitride/silicon oxide or silicon nitride/silicon oxide.

The floating gate dielectric layer 218 is formed on the substrate 200 at least between the stacked structures 300 or further at both sides of the stacked structures 300. The material of the floating gate dielectric layer 218 is, for instance, silicon oxide, or other layers that allow hot electrons pass through it by tunneling effect. The forming method of the floating gate dielectric layer 218 is, for instance, a thermal oxidation or deposition method, but not limited thereto.

Figure 6:
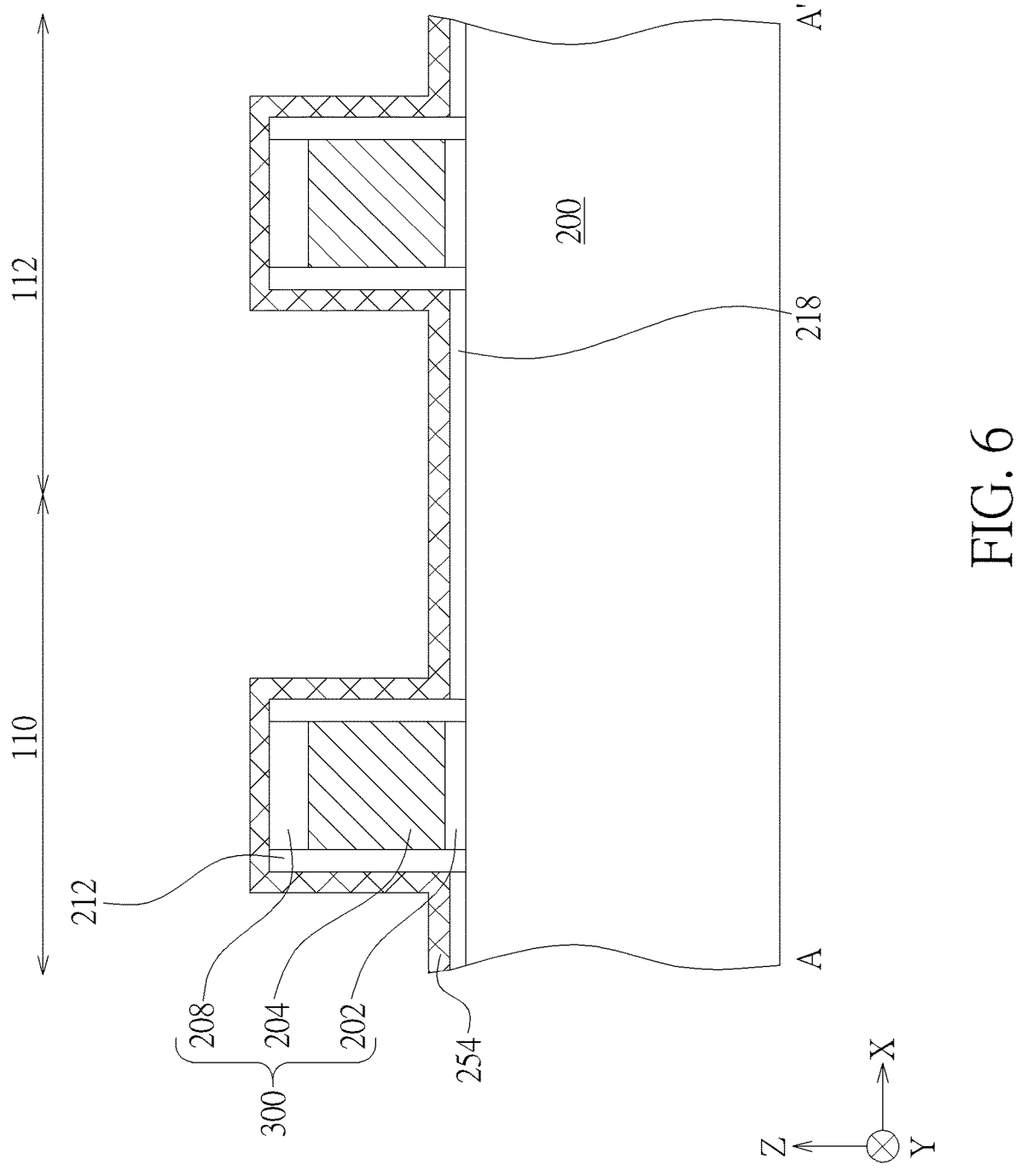

Referring to FIG. 6, a conformal conductive layer 254 is formed on the substrate 200 and the select gate 204, and the conformal conductive layer 254 conforms to the shape of the structure underneath. The material of the conformal conductive layer is, for instance, doped polysilicon, polycide or other suitable conductive material. When the material of the conductive layer is doped polysilicon, its forming method includes, for instance, performing an ion implantation step after an undoped polysilicon layer is formed via a chemical vapor deposition method; or performing a chemical vapor deposition method with an in-situ dopant implantation method.

Then, a photolithography and etching processes are performed to etch the conformal conductive layer. As a result, the conductive layer can be patterned to form a plurality of conductive strips (not shown) that are separated from each other as viewed from a top-down perspective. Each of the conductive strips can extend along the X-direction, and at least in the first memory cell region 110 and the second memory cell region 112.

Figure 7:
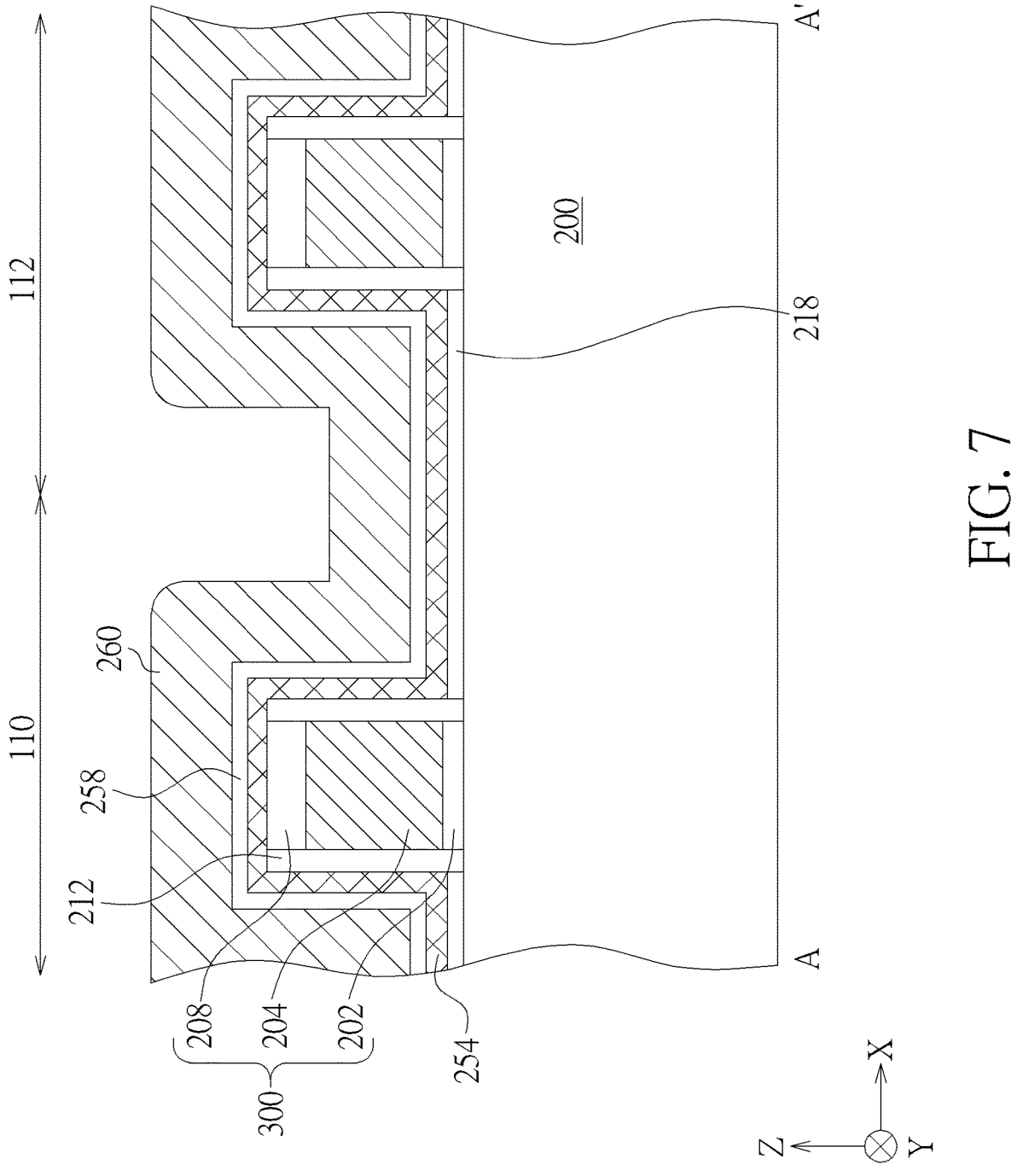

Referring to FIG. 7, a coupling dielectric layer 258 covering the conformal conductive layer 254 is formed on the substrate 200. Since the conformal conductive layer 254 is stripe-shaped as viewed from a top-down perspective, the coupling dielectric layer 258 covers not only the top surface of the conformal conductive layer 254 but also the sidewalls (not shown) of the conformal conductive layer 254. The coupling dielectric layer 258 can be a composite dielectric layer including silicon oxide/silicon nitride/silicon oxide, but not limited thereto.

Then, a control gate layer 260 is disposed on the coupling dielectric layer 258. The thickness of the control gate layer 260 can be properly controlled so that the control gate layer 260 can conform to the shape of the underlying structure. The control gate layer 260 can be made of conductive material such as poly silicon or metal, but not limited thereto.

Figure 8:
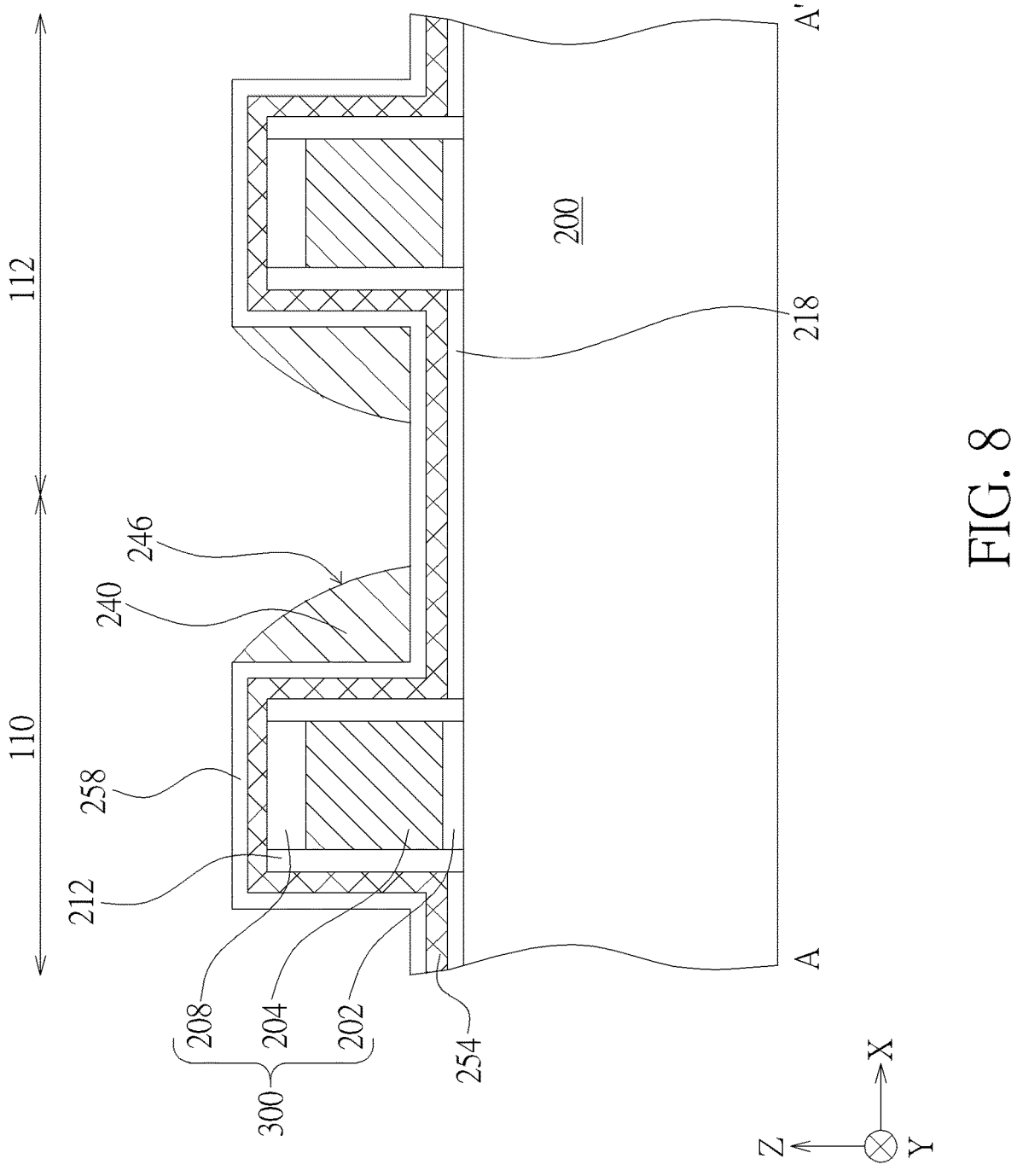

Referring to FIG. 8, the control gate layer 260 is then etched by an anisotropic etching process to thereby form the control gate 240 on the sidewall of the stacked structure 300. The control gate 240 is a self-aligned structure with a non-vertical surface 246, and thus there is no need to use the photolithography process. After the formation of the control gate 240, the control gates 240 respectively in the first memory cell region 110 and the second memory cell region 112 can be laterally separated from each other in the X-direction. Besides, after the formation of the control gate 240, the portion of the coupling dielectric layer 258 that disposed over the stacked structure 300 can be exposed from the control gate 240.

Figure 9:
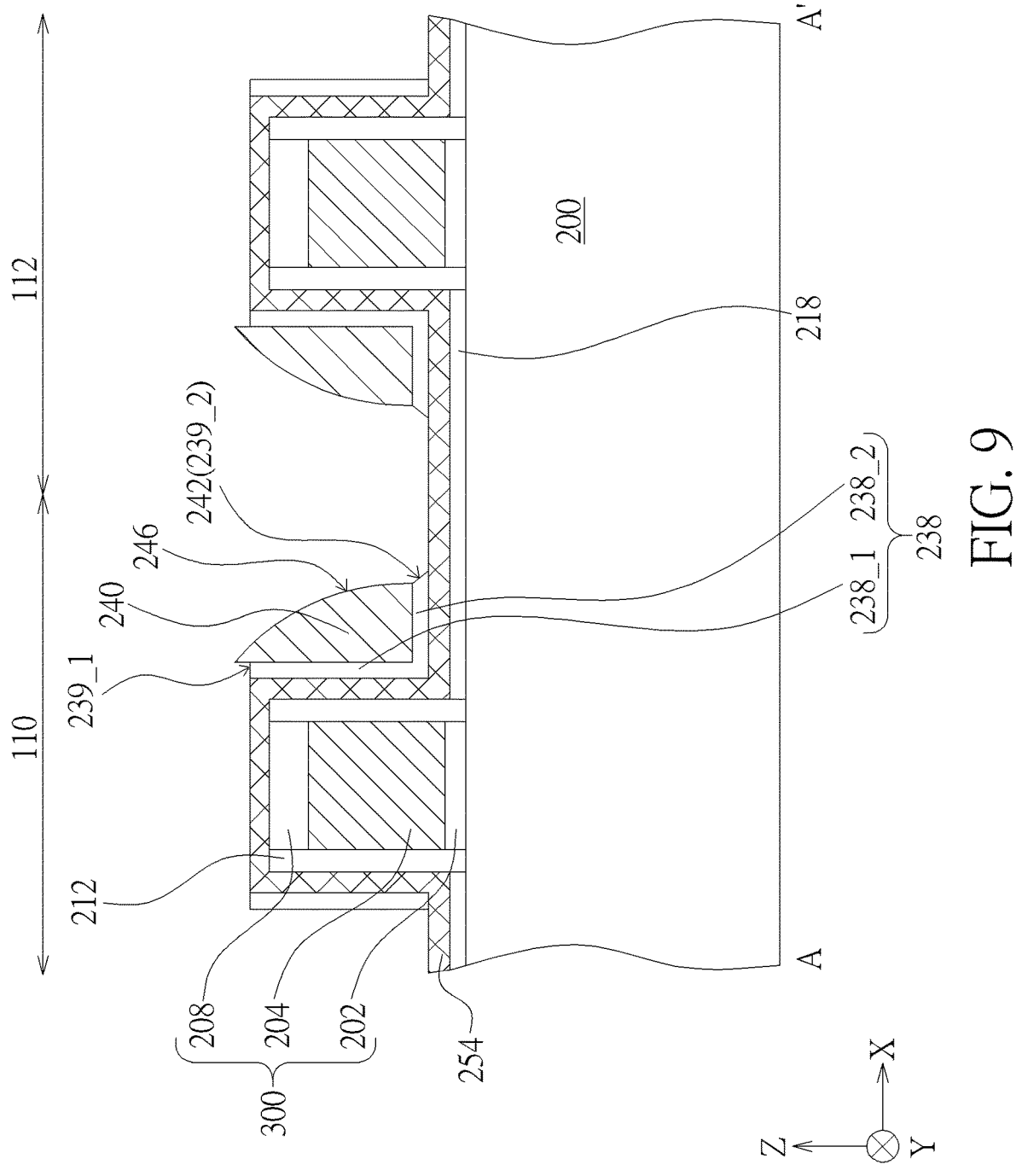

Referring to FIG. 9, by using the control gate layer 260 as an etch mask, an anisotropic etching process is performed on the coupling dielectric layer to form a coupling dielectric layer 238 which is an L-shaped structure including the vertical portion 238_1 and the horizontal portion 238_2. By properly controlling the etching recipe and types or ratios of etchants, the top surface 239_1 of the vertical portion 238_1 can be a flat or concave surface which is lower than the top tip of the control gate 240. Besides, the end portion 242 of the horizontal portion 238_2 of the coupling dielectric layer 238 can extend from below the control gate 240 and is partially exposed from the control gate 240. The end portion 242 of the horizontal portion 238_2 of the coupling dielectric layer 238 includes the non-vertical sidewall 239_2 extending and exposed from the control gate 240. After the formation of the coupling dielectric layer 238 including the vertical portion 238_1 and the horizontal portion 238_2, the portion of the conformal conductive layer 254 that is at the boundary between the first memory cell region 110 and the second memory cell region 112 can be exposed.

Figure 10:
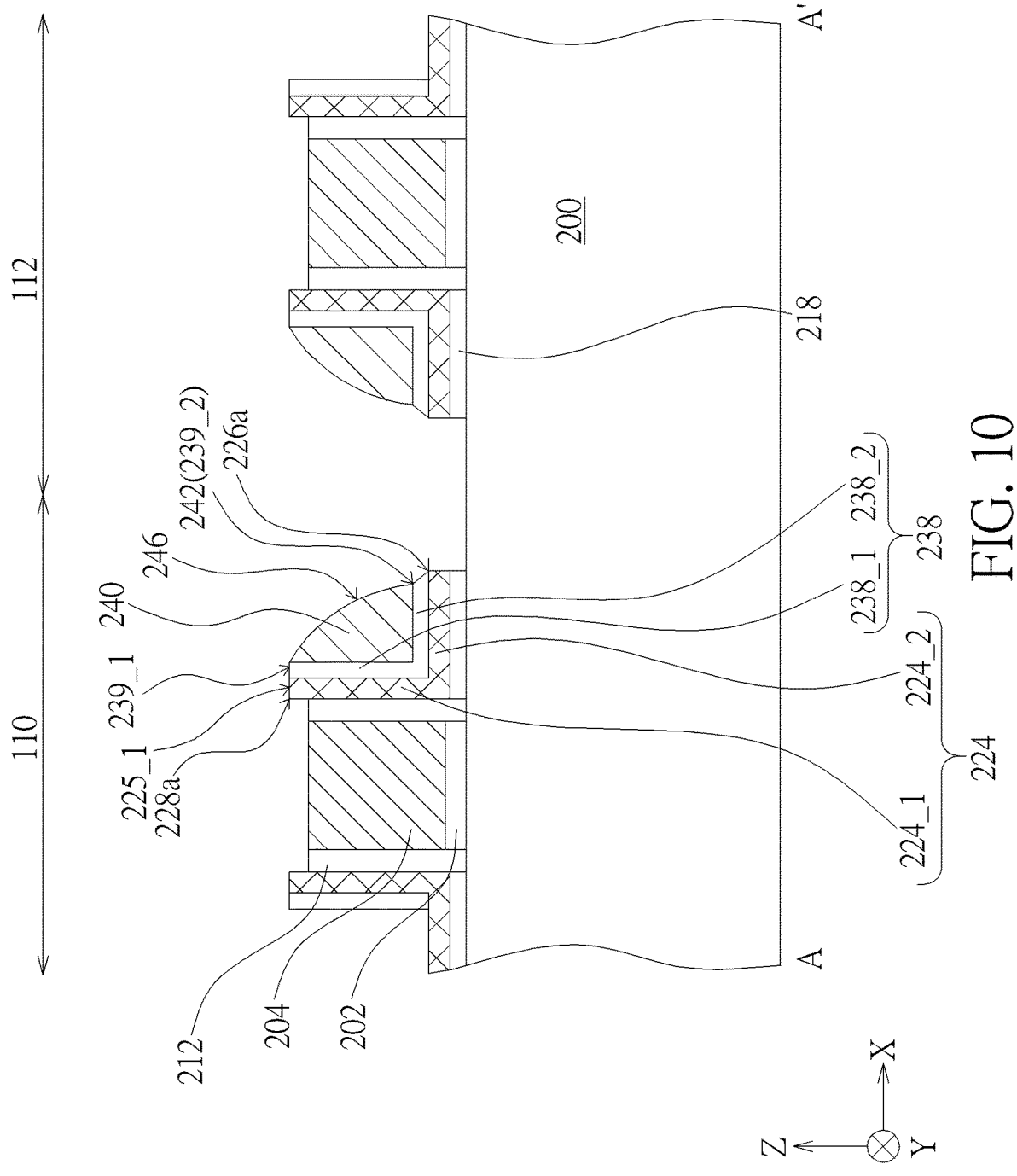

Afterwards, referring to FIG. 10, the conformal conductive layer 254 is etched using the control gate 240 and the coupling dielectric layer 238 as an etch mask to thereby form the floating gate 224. The floating gate 224 is an L-shaped structure includes the vertical portion 224 land the horizontal portion 224_2. By using the control gate 240 and the coupling dielectric layer 238 as the etch masks, there is no need to perform additional photolithography process to define the shape of the floating gate 224. The horizontal portion 224_2 of the floating gate 224 includes a lateral tip 226a which is not covered with the control gate 240. Furthermore, during the formation of the floating gate 224, portions of the control gate 240 can be etched concurrently and the height of the control gate 240 may be slightly reduced. Even if the size of the control gate 240 is reduced during the etching process, however, the size of coupling dielectric layer 238 is not reduced much since the composition of the coupling dielectric layer 238 is different from the composition of the floating gate 224. After the formation of the floating gate 224, the floating gate dielectric layer 218 can also be etched to expose the substrate 200 at the boundary between the first memory cell region 110 and the second memory cell region 112.

Figure 11:
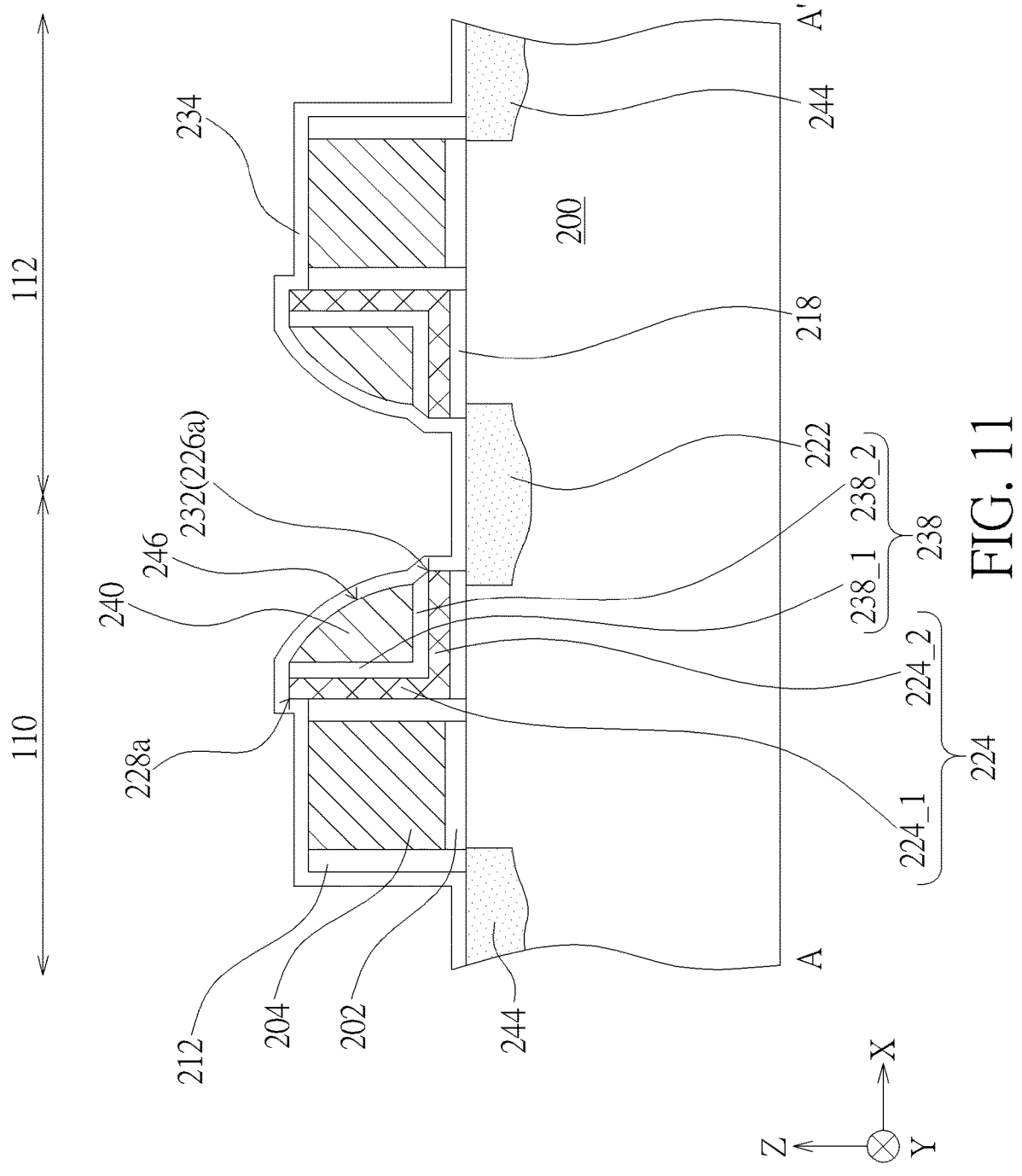

Referring to FIG. 11, at least one drain region 244, such as two drain regions 244, may be formed at sides of the select gates 204. The drain regions 244 are disposed in the first memory cell region 110 and the second memory cell region 112 respectively, which can be electrically coupled to each other through vias or contacts in the subsequent manufacturing processes. Besides, a source region 222 can be concurrently formed in the substrate 200 between the control gates 220.

The forming method of the drain region 244 and the source region includes, for instance, performing an ion implantation process. The implanted dopant can be an n-type or p-type dopant as decided according to the design of the device. The dopants and the doping concentrations of the source region 222 and the drain region 244 can be the same and can also be different.

An erase gate dielectric layer 234 is then conformally formed on the select gate 204, the floating gate 224 and the control gate 240.

Afterwards, the erase gate and other components may be formed so as to obtain a non-volatile memory device similar to the structures shown in FIGS. 1 to 4.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory device, comprising at least one memory cell, wherein the at least one memory cell comprises:
   a substrate;
   a select gate disposed on the substrate;
   a control gate disposed on the substrate and laterally spaced apart from the select gate, wherein the control gate comprises a non-vertical surface;
   a floating gate disposed on the substrate and comprising:
   a vertical portion disposed between the select gate and the control gate, wherein the vertical portion comprises a first top tip laterally spaced apart from the control gate; and a horizontal portion disposed between the substrate and the control gate, wherein the horizontal portion comprises a lateral tip laterally and vertically spaced apart from the control gate; and an erase gate covering the non-vertical surface of the control gate and the lateral tip of the horizontal portion of the floating gate.

2. The non-volatile memory device of claim 1, wherein the non-vertical surface of the control gate comprises an inclined surface or a curved surface.

3. The non-volatile memory device of claim 1, wherein a bottom surface of the control gate is lower than a top surface of the vertical portion of the floating gate.

4. The non-volatile memory device of claim 1, wherein the first top tip of the vertical portion of the floating gate is higher than a top surface of the select gate.

5. The non-volatile memory device of claim 1, wherein the floating gate further comprises a corner portion at a lower corner of the floating gate, the corner portion being laterally spaced apart from the control gate.

6. The non-volatile memory device of claim 1, wherein the vertical portion of the floating gate further comprises:

two first top tips opposite each other and arranged along a first direction;

two first sidewalls opposite each other and arranged along the first direction, wherein the first sidewalls are connected to the first top tips respectively; and two second sidewalls opposite each other and arranged along a second direction different from the first direction, wherein the control gate extends along the second direction and covers the two second sidewalls of the vertical portion of the floating gate.

7. The non-volatile memory device of claim 1, wherein the erase gate comprises a flat top surface, and the height of the erase gate is at most 20% higher than the height of the select gate.

8. The non-volatile memory device of claim 1, wherein the erase gate further covers a top surface of the vertical portion of the floating gate.

9. The non-volatile memory device of claim 1, further comprising a further erase gate laterally spaced apart from the erase gate and covering a top surface of the vertical portion of the floating gate.

10. The non-volatile memory device of claim 9, wherein the erase gate is configured to be biased with a first voltage, and the further erase gate is configured to be biased with a second voltage different from the first voltage.

11. The non-volatile memory device of claim 1, further comprising a coupling dielectric layer disposed between the control gate and the floating gate, wherein the coupling dielectric layer comprises:

a vertical portion disposed between the control gate and the vertical portion of the floating gate; and a horizontal portion disposed between the control gate and the horizontal portion of the floating gate, wherein a portion of the horizontal portion of the coupling dielectric layer extends from below the control gate and is exposed from the control gate.

12. The non-volatile memory device of claim 11, wherein the horizontal portion of the coupling dielectric layer comprises a non-vertical sidewall exposed from the control gate.

13. The non-volatile memory device of claim 1, further comprising a dielectric spacer disposed between the select gate and the vertical portion of the floating gate, wherein the dielectric spacer comprises a curved top surface lower than a top surface of the vertical portion of the floating gate.

14. The non-volatile memory device of claim 1, wherein the at least one memory cell comprising a first memory cell and a second memory cell, each of the first memory cell and the second memory cell comprising the select gate, the floating gate and the control gate, the non-volatile memory device further comprises a source region shared by the first memory cell and the second memory cell, and the source region is covered with the erase gate.

15. The non-volatile memory device of claim 14, wherein the first memory cell and the second memory cell have a mirror image of each other.

16. The non-volatile memory device of claim 14, wherein the erase gate is filled into a gap between the control gates of the first memory cell and the second memory cell.

* * * * *